(12) United States Patent  
Paranjpye et al.

(10) Patent No.: US 7,872,432 B2  
(45) Date of Patent: Jan. 18, 2011

(54) MEMS THERMAL DEVICE WITH SLIDEABLY ENGAGED TETHER AND METHOD OF MANUFACTURE

(75) Inventors: Alok Paranjpye, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 1272 days.

(21) Appl. No.: 11/378,340

(22) Filed: Mar. 20, 2006

(65) Prior Publication Data

US 2007/0215448 A1    Sep. 20, 2007

(51) Int. Cl.
*H02N 11/00* (2006.01)
(52) U.S. Cl. .......................... 318/117; 60/528; 310/306
(58) Field of Classification Search ......... 310/306–307; 318/117; 60/527–528
See application file for complete search history.

(56) References Cited

U.S. PATENT DOCUMENTS

| | | | |
|---|---|---|---|
| 5,955,817 A * | 9/1999 | Dhuler et al. ............... | 310/307 |
| 6,268,635 B1 | 7/2001 | Wood | |
| 6,407,478 B1 | 6/2002 | Wood et al. | |
| 7,582,969 B2 | 9/2009 | Carlson et al. | |
| 7,724,121 B2 * | 5/2010 | Rubel ......................... | 337/139 |
| 2004/0211178 A1 | 10/2004 | Menard et al. | |
| 2007/0207584 A1 | 9/2007 | Paranjpye et al. | |

* cited by examiner

*Primary Examiner*—Burton Mullins  
(74) *Attorney, Agent, or Firm*—Jaquelin K. Spong

(57) ABSTRACT

A MEMS thermal switch is disclosed which couples a hot, expanding beam to a cool flexor beam using a slideably engaged tether, and bends the cool, flexor beam by the expansion of the hot beam. A rigidly engaged tether ties the distal ends of the hot, expanding beam and the cool, flexor beam together, whereas the slideably engaged tether allows the hot, expanding beam to elongate with respect to the cool, flexor beam, without loading the slideably engaged tether with a large shear force. As a result, the material of the tether can be made stiffer, and therefore transmit the bending force of the hot, expanding beam more efficiently to the cool, flexor beam.

20 Claims, 8 Drawing Sheets

MEMS THERMAL DEVICE WITH SLIDEABLY ENGAGED TETHER AND METHOD OF MANUFACTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a microelectromechanical systems (MEMS) thermal switch and its method of manufacture. More particularly, this invention relates to a MEMS thermal switch having a tether slideably engaged with a hot, expanding beam and rigidly engaged with a cool, passive beam.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be used to connect one or more electrical input terminals to one or more electrical output terminals, all microfabricated on a substrate. The actuation means for the moveable switch may be thermal, piezoelectric, electrostatic, or magnetic, for example.

A thermal electrical switch may be formed, for example, by disposing an expanding beam adjacent to a passive cantilever, and causing the expanding beam to expand, thereby deflecting the passive cantilever. In one known embodiment, the expanding beam is a conductive circuit through which a current is driven to heat the conductive circuit. The conductive circuit may be tethered to the passive cantilever, also called herein a flexor beam, by a dielectric tether, such that the current does not flow to the passive cantilever from the conductive circuit. The conductive circuit may heat from Joule heating and expand relative to the passive cantilever, thus bending the passive cantilever to which it is tethered. If the passive cantilever is coupled to an electrical input terminal carrying an electrical signal, energizing the conductive circuit may deflect the passive cantilever to a position in which it is in contact with another electrical output terminal, thereby connecting an input terminal to an output terminal. The conductive circuit and passive cantilever may therefore constitute an electrical switch The dielectric tether may therefore be coupled to both the conductive circuit as well as the passive cantilever. The expansion of the conductive circuit generates a force in the longitudinal direction, which is converted into a lateral, bending force by the rigid attachment of the dielectric tether. The dielectric tether of this thermal switch therefore applies a force in a lateral direction against the passive cantilever, in order to cause the passive cantilever to bend laterally in the desired direction However, because the conductive circuit expands longitudinally, the expanding beam also exerts a shear force on the dielectric tether, in a direction orthogonal to the desired bending direction Accordingly, the dielectric tether may be required to accommodate a substantial amount of shear force while converting the shear force to the desired lateral force. Excessively large shear forces may lead to cracking and delamination of the dielectric tether.

Therefore, in order to avoid large stresses, the dielectric tether may be made from a relatively compliant material. The compliance of the material may reduce the efficiency of the device, however, because some amount of the force exerted goes into the deformation of the compliant material, rather than to the deflection of the passive cantilever in the desired direction. Accordingly, using compliant materials reduces the mechanical and thermal efficiency of the device, by requiring higher temperatures to produce the desired amount of deflection in the passive cantilever.

SUMMARY

Systems and methods are described here which address the above-mentioned problems, and may be particularly applicable to the formation of a MEMS thermal switch The systems and methods include at least one tether which is slideably engaged with a hot, expanding beam, allowing the hot, expanding beam to expand by sliding along and through the tether, thereby avoiding the application of a shear stress to the tether. The slideably engaged tether is then rigidly coupled to a passive cantilever, in order to apply the lateral bending force to the passive cantilever, or flexor beam.

The systems and methods described here may therefore include a MEMS thermal device, comprising at least one flexor beam formed over a substrate and at least one expanding beam formed adjacent to the flexor beam and at least one slideably engaged tether rigidly adhered to the at least one flexor beam and slideably engaged with the at least one expanding beam The slideably engaged tether allows a portion of the at least one expanding beam to slide longitudinally relative to the flexor beam, but constrains the expanding beam from moving laterally relative to the flexor beam.

The slideably engaged tether may be made from a dielectric polymer material such as SU8 photoresist, developed by IBM Corporation of Armonk, N.Y. In one exemplary embodiment, the slideably engaged tether may be manufactured by depositing a sacrificial material over the expanding beam, and then depositing the SU8 photoresist over the sacrificial material to form the dielectric tether. After curing the SU8, the sacrificial layer may be removed, leaving a gap for the sliding contact between the SU8 dielectric tether and the hot, expanding beam.

The sliding gap between the tether and the hot, expanding beam may be anywhere between about 200 nm and about 1.5 µm depending on the requirements of the application. Because the slideably engaged tether allows the hot, expanding beam to expand without applying a shear force to the dielectric tether, the tether may be made from relatively stiff material, which allows efficient transmission of the expansion force to the bending of the passive cantilever, or flexor beam.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to a MEMS thermal switch. However, it should be understood that this embodiment is exemplary only, and that the systems and methods disclosed herein may be used in any number of applications requiring structures to move relative to one another. Moreover, the systems and methods are described with regard to a thermal actuator which uses a current-carrying hot beam tethered to a passive flexor beam. However, it should be understood that the systems and methods may be applied to any of a number of other thermal actuators, such as bimorphs, homogeneous, or differential temperature driven actuators.

The MEMS thermal device may, in general, include at least one hot, expanding beam disposed adjacent to a cool passive bean The cool, passive beam is also called a "flexor" beam herein, because it is designed to flex in a desired direction, as a result of the force exerted by the hot, expanding beam The ends of the hot, expanding beam are coupled to the ends of the flexor beam, such that the expansion of the hot, expanding beam causes it to bend the flexor beam The bending of the flexor beam is then used to close an electrical switch. In the systems and methods disclosed here, the hot, expanding beam is coupled in its midsection to the flexor beam using a slideably engaged tether. The slideably engaged tether allows at least a portion of the hot, expanding beam to slide along and through the tether, thereby reducing the shear stress on the slideably engaged tether. The hot, expanding beams may be, for example, conductive beams forming an electrical circuit, which, when current is applied, may heat due to the Joule heating of the flowing current within the conductive beams.

Figure 1:
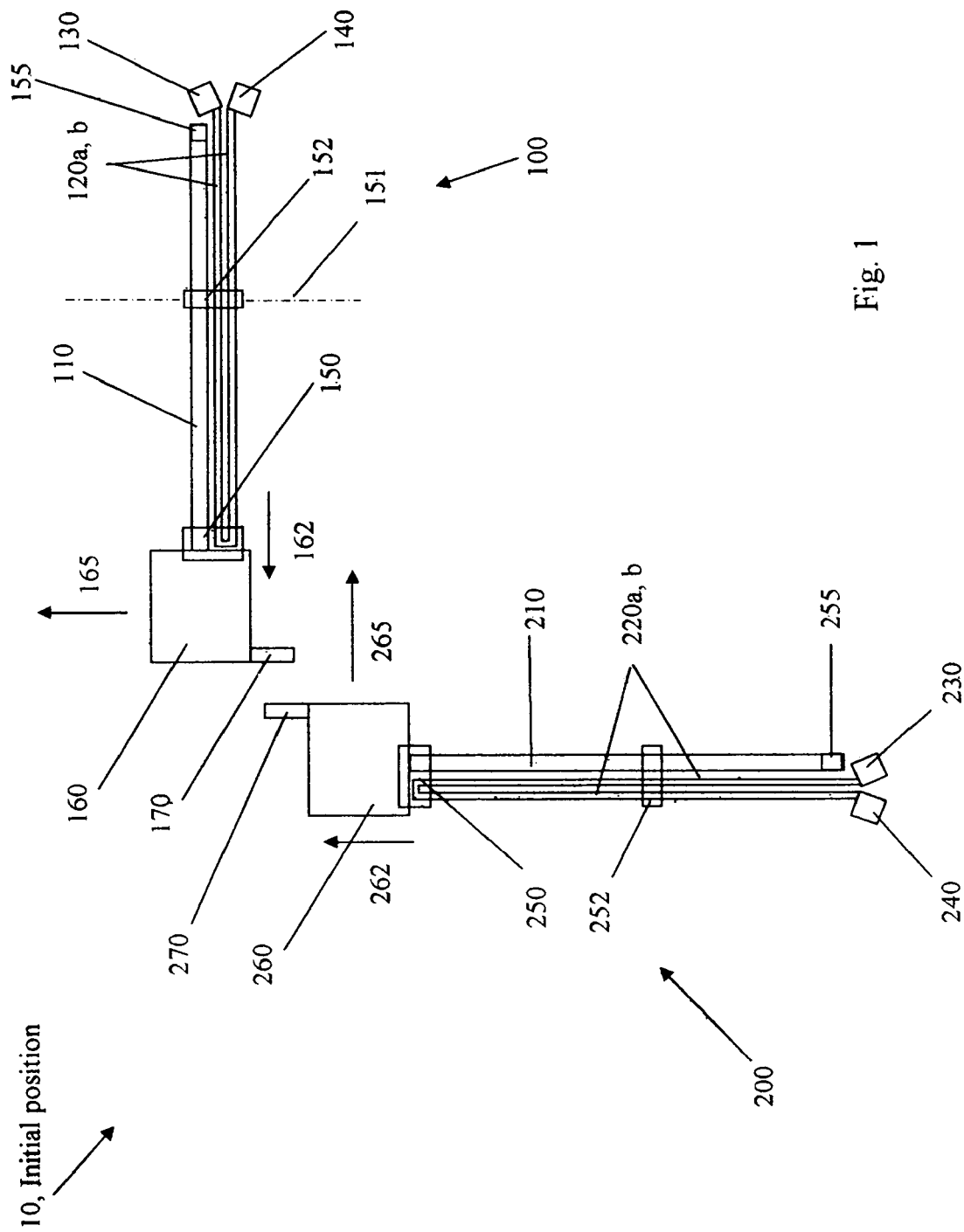
FIG. 1 is a diagram showing an exemplary MEMS thermal switch using the slideably engaged tether.

FIG. 1 shows an example of a MEMS thermal switch 10 which may use the slideably engaged tether. The thermal switch 10 includes two cantilevers, 100 and 200. Each cantilever 100 and 200 includes a flexor beam 110 and 210, respectively, and conductive circuits 120a and b and 220a and b, respectively. The flexor beams may be the cool, passive beams and the conductive beams 120a and b may be the hot, expanding beams in this embodiment.

Each of conductive circuits 120a and b and 220a and b is coupled to flexor beams 110 and 210 by a set of at least two dielectric tethers, which transmit the motion of the conductive circuits 120a and b and 220a and b to the flexor beams 110 and 210. A first dielectric tether 150 is a distal dielectric tether, which tethers the distal ends of conductive circuit 120a and b to flexor beam 110. A second dielectric tether 152 is a medial dielectric tether, which couples a medial portion of conductive circuit 120a and b to flexor beam 110. Similarly, dielectric tether 250 is a distal dielectric tether, which tethers the distal ends of conductive circuit 220a and b to flexor beam 210. Another dielectric tether 252 is a medial dielectric tether, which couples a medial portion of conductive circuit 220a and b to flexor beam 210.

The tethers 150, 152 and 250, 252 may be made from a dielectric material, so that the current does not flow from the conductive circuit 120a and b or 220a and b to the flexor beam 110 or 210, respectively. When a voltage is applied between terminals 130 and 140, a current is driven through conductive circuit 120a and b. The Joule heating generated by the current causes the circuit 120a and b to expand relative to the unheated flexor beam 110. Since the conductive circuit 120a and b is coupled to the flexor beam 110 by the dielectric tethers 150 and 152, the expanding conductive circuit 120a and b drives the flexor beam in the upward direction 165. Similarly, since the conductive circuit 220a and b is coupled to flexor beam 210 by the dielectric tethers 250 and 252, the expanding conductive circuit 220a and b drives the flexor beam 210 in the rightward direction 265, when a current is applied between terminals 230 and 240.

The switch is closed when the contact members 160, 170, 260 and 270 are placed into electrical contact by the movement of cantilevers 100 and 200. In particular, cantilever 100 is moved in direction 165 by application of a current to terminals 130 and 140, after which cantilever 200 is moved in direction 265 by application of current to terminals 230 and 240. Thereafter, cantilever 100 is allowed to relax, followed by cantilever 200. However, cantilever 200 is prevented from returning to its original position by mechanical interference from contact member 170, so that contact member 270 rests against contact member 170, establishing an electrical connection between flexor beam 110 and flexor beam 210, thereby closing the electrical switch. If an input electrical signal is applied to terminal 255, it appears at output terminal 155 by flowing through the contacts 170 and 270 of the switch in the closed position.

Figure 2:
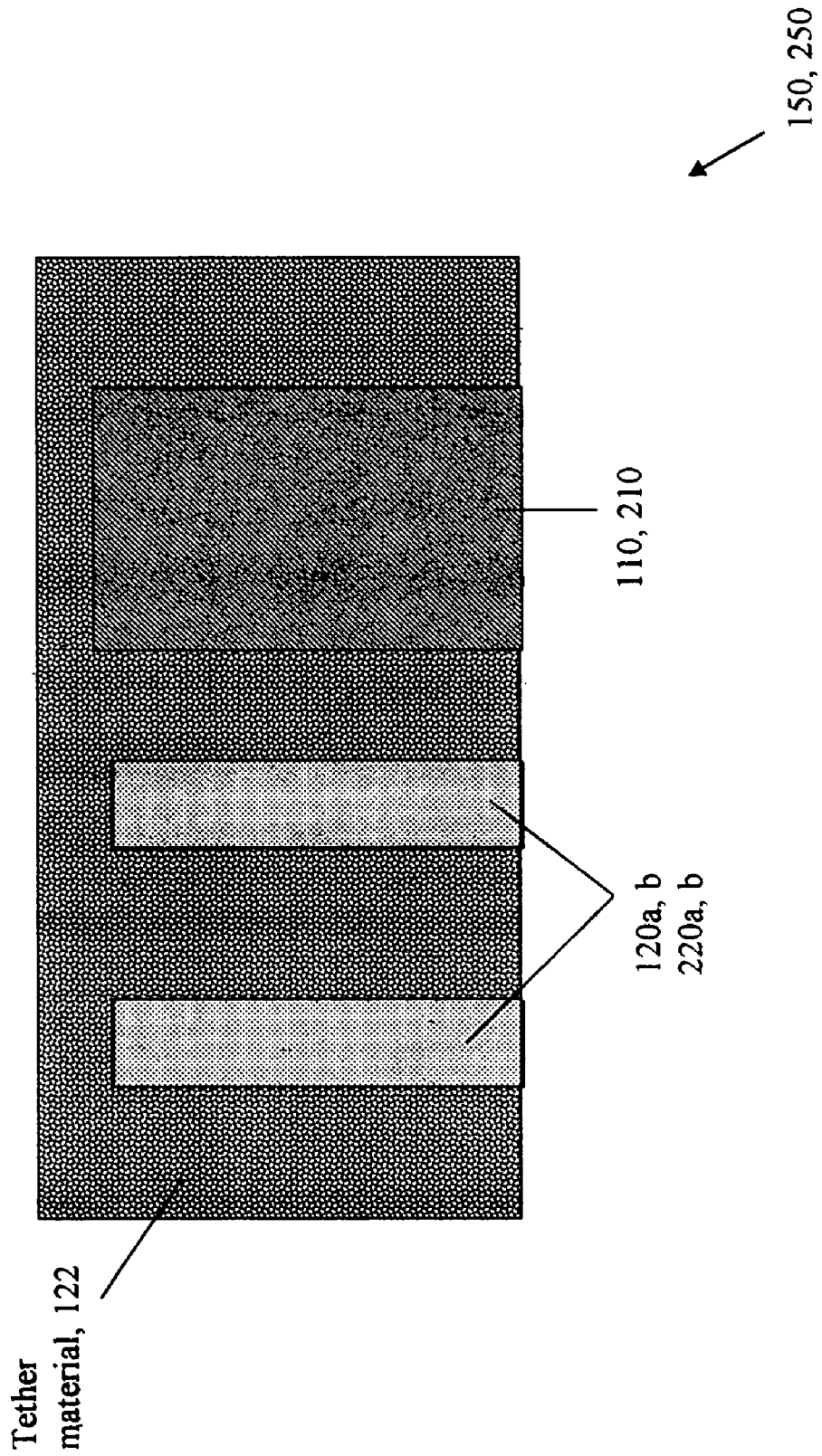
FIG. 2 is a diagram of the tether used at the distal end of the MEMS thermal switch shown in FIG. 1.

Because conductive circuits 120a and b and 220a and b expand relative to flexor beams 110 and 210, a component of the force from the expansion goes into a shear force in direction 162 and 262 along beams 100 and 200, respectively. This shear force is accommodated by the compliance of distal dielectric tethers 150 and 250. Distal dielectric tethers 150 and 250 are disposed at the distal ends of cantilevered beams 100 and 200, and translate the shear expansion force into a deflection force, by coupling the ends of the conductive circuits 120a and b and 220a and b rigidly to flexor beams 110 and 210. The term "rigidly coupled" should be understood to mean that the surfaces of the distal dielectric tether are adhered mechanically to the surfs of conductive circuits 120a and b and 220a and b, and to the surfaces of flexor beams 110 and 210. Because of the rigid coupling of the conductive circuits 120a and b and 220a and b to flexor beams 110 and 210 at the distal ends, the longer length of the conductive circuits 120a and b and 220a and b relative to flexor beams 110 and 210 is accommodated by the bowing of the conductive circuits 120a and b and 220a and b and flexor beams 110 and 210 in the directions 165 and 265, respectively. Distal dielectric tethers 150 and 250 which rigidly couple the conductive circuits 120a and b and 220a and b to flexor beams 110 and 210, respectively, are shown in FIG. 2. The tether material 122 may be, for example, cured SU8 photoresist.

The second, medial dielectric tether 152 is disposed in the medial region between proximal anchor points 130, 140 and 155 of the cantilevered beams 110 and 120a and b and the distal ends. Similarly, medial dielectric tether 252 is disposed in the medial region between the anchor points 230, 240 and 255 of the cantilevered beams 210 and 220a and b and the distal ends. Medial dielectric tethers 152 and 252 inhibit the buckling of the conductive circuit 120a and b away from the flexor beam 110 in its midsection. There is no requirement for medial dielectric tether 152 or 252 to be rigidly coupled to the conductive circuit 120 or 220a and b, respectively, and therefore medial dielectric tethers 152 and 252 may be slideably engaged with conductive circuits 120a and b and 220a and b. The term "slideably engaged" should be understood to mean that the dielectric tether is not rigidly, mechanically coupled to the conductive circuit, but rather that the surfaces of the conductive circuit are allowed to slide relative to the surfaces of the dielectric tether. Accordingly, the slideably engaged tethers 152 and 252 allow the expanding beams 120a and b or 220a and b to slide longitudinally (along their long axes) relative to flexor beam 110 or 210, respectively, but constrains the expanding beams 120a and b or 220a and b from moving laterally (perpendicularly to their long axes) relive to flexor beam 110 or 210. As a result, relatively little shear force is exerted on medial dielectric tethers 152 and 252, while also eliminating the possibility of column failure or buckling of the expanding beams.

While the MEMS thermal switch 10 is shown having a single medial slideably engaged dielectric tether 152 and 252 on each conductive circuit 120a and b and 220a and b, respectively, it should be understood that this embodiment is exemplary only, and in other exemplary embodiments, the MEMS thermal switch may have ay number of additional medial slideably engaged dielectric tethers, depending on the requirements of the application.

Figure 3:
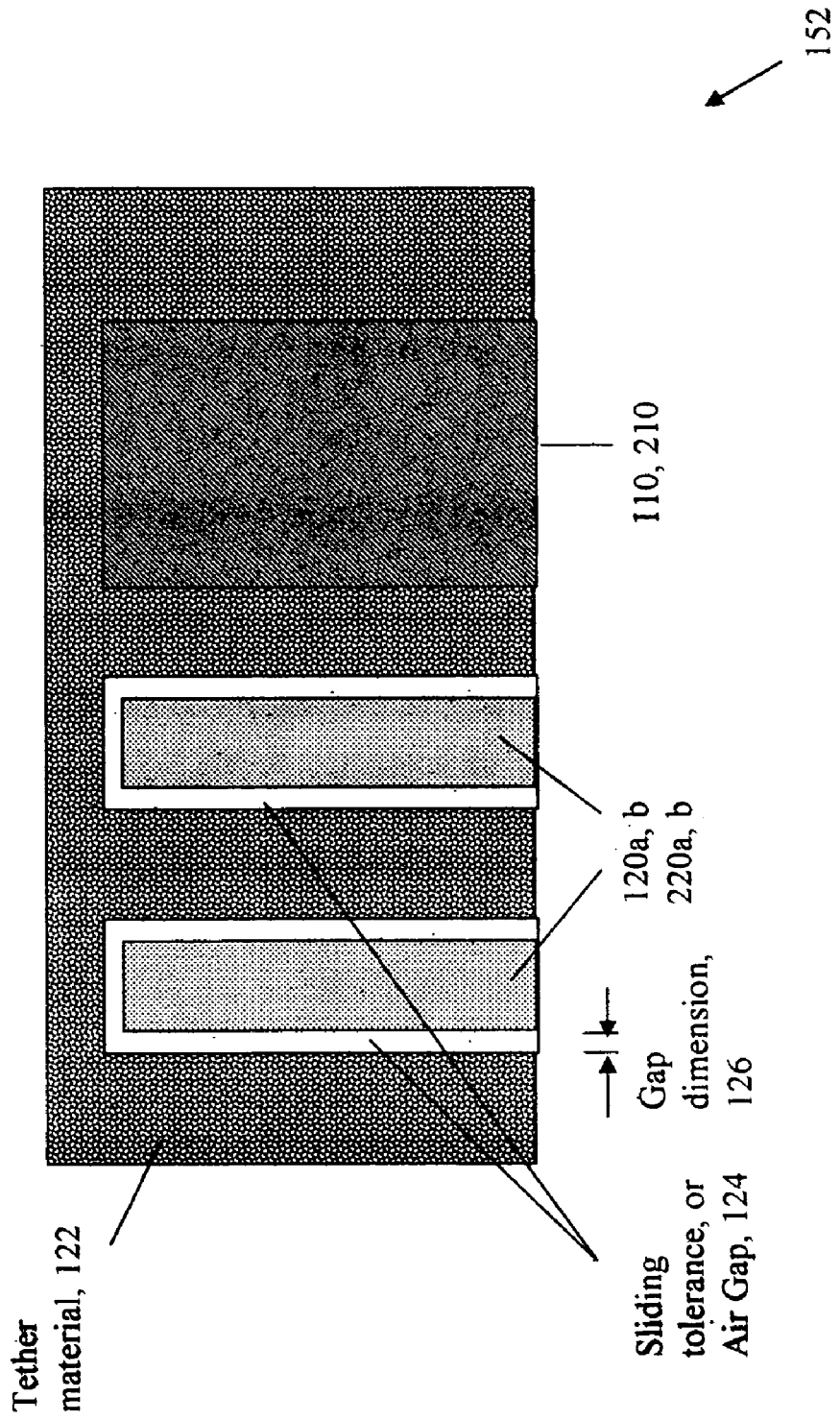
FIG. 3 is a diagram of the slideably engaged tether used in medial portion of the MEMS thermal switch of FIG. 1.

In order to allow the slideable contact, medial dielectric tethers 152 and 252 may be constructed as shown in FIG. 3. FIG. 3 is a cross section of the slideable contact, medial dielectric tether 152 taken along, for example, the dashed line 151 shown in FIG. 1. In order to allow the slideable engagement, one or more gaps 124 may be left between the surfaces of the conductive circuits 120a, b and 220a, b and the tether material 122. The dimension 126 of the gap may be between about 200 nm and about 1.5 µm, depending on the application The gap may be of constant dimension in the orthogonal direction (into the page of FIG. 3) along the entire length of the dielectric tether, which may be between about 10 µm to about 50 µm long. The dimension 126 of the gap 124 may be made large enough to accommodate the maximum bending of the conductive circuits 120a, b and 220a, b without binding, but small enough to transmit most of the motion of the conductive circuit 120a and b to the flexor beam 110. As the size of gap 124 directly reduces the amount of deflection delivered to the flexor beam 110, it may, in general, be made as small as practical while still ensuring a sliding engagement. The maximum bending to be accommodated may be estimated using, for example, a finite element model of conductive circuits 120a, b and 220a, b and modeling the flow of current through the conductive circuits 120a, b and 220a, b and the consequential build up of heat.

The gap 124 may, in general, be filled only with ambient air. Alternatively, a lubricating material may also be disposed in the gap 124, such as a thin fluorocarbon film, for example, approximately 10 to 20 Angstroms thick, and with some bonding affinity for the dielectric surface. Examples of the fluorocarbon materials include AM2001 or Z-Dol, common lubricants sold by Dupont Corp. (Wilmington, Del.). The inclusion of the lubricating material may discourage the binding of the slideably engaged dielectric tether with the conductive circuits 120a, b or 220a, b.However, it should be understood that the inclusion of the lubricating material is optional, and may depend on other design considerations.

An exemplary method for fabricating the MEMS switch 10 with slideably engaged dielectric tethers will be described next, with reference to FIGS. 4-8. Particular attention will be given to the slideably engaged dielectric tether portion 152 and 252 of the MEMS switch 10, as was shown in FIG. 3. The cross sections shown in FIGS. 4-8 may be taken along the dashed line 151 shown in FIG. 1. Because in FIGS. 4-8, a portion of compact MEMS switch 10 is shown in cross section along the dashed line 151, only one set of cantilevered beams, 110 and 120a and b, of the two sets 100 and 200 of cantilevered beams of the MEMS thermal switch 10 is shown. However, it should be understood that the second set of cantilevered beams 220a, b and 210 may be formed at the same time as, and using similar or identical processes to those used to form the first set 120a, b and 110 of cantilevered beams which are depicted in the figures. Furthermore, in order to avoid complicating the figures, the contact members 160 and 170 are not shown, however, they should be understood to be formed at the distal end of flexor beam 110.

It should be understood that the method depicted in FIGS. 4-8 is exemplary only, and that any number of alternative methods may be envisioned for the manufacture of the slideably engaged tether 152 and 252. Furthermore, although FIGS. 4-8 are directed to the manufacture of slideably engaged dielectric tether 152, it should be understood that slideably engaged tether 252 may be manufactured using a similar, or identical process.

Figure 4:
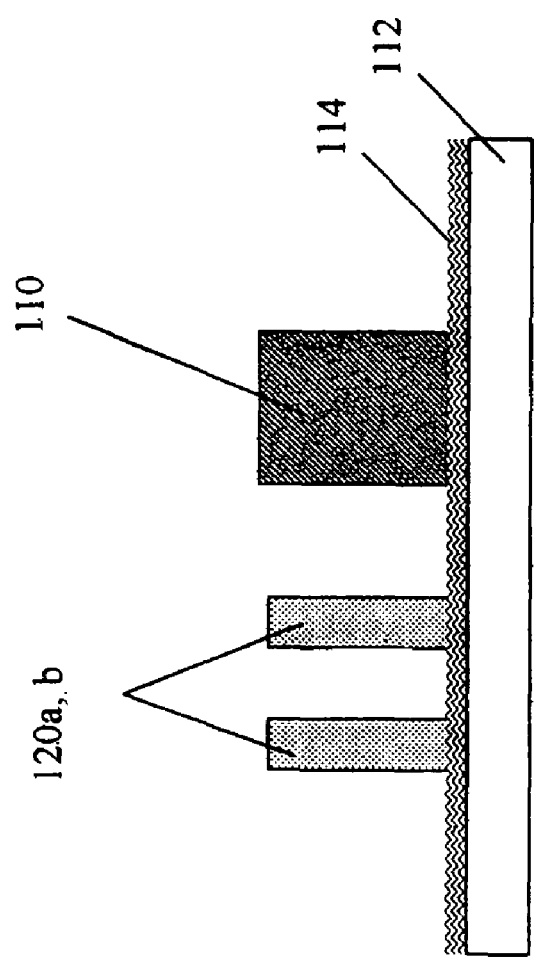
FIG. 4 is a diagram showing a first exemplary step in the manufacture of the slideably engaged tether.

FIG. 4 is a diagram illustrating a first exemplary step in a method for manufacturing the MEMS switch 10 with slideable tether of FIG. 3. As shown in FIG. 4, a sacrificial layer 114 is first deposited on the surface of a substrate 112. The substrate material may be any convenient choice, for example silicon, silicon-on-insulator (SOI), glass, or the like. The sacrificial layer 114 may be, for example copper which is electroplated onto the substrate surface 112. The deposition of the sacrificial layer may have been preceded by the formation of a seed layer (not shown), to seed the formation of the electrochemically deposited sacrificial layer 114. The seed layer may be chromium (Cr) and/or gold (Au), deposited by chemical vapor deposition (CVD) or sputter deposition to a thickness of 100-200 nm Photoresist may then be deposited over the seed layer, and patterned by exposure through a mask. A sacrificial layer 114, such as copper, may then be electroplated over certain portions of the seed layer. In FIG. 4, the sacrificial layer 114 is electroplated over the entire surface of the substrate 112. The plating solution may be any standard commercially available or in-house formulated copper plating bath. Plating conditions are particular to the manufacturer's guidelines. However, any other sacrificial material that can be electroplated may also be used. In addition, deposition processes other than plating may be used to form sacrificial layer 114. The photoresist may then be stripped from the substrate 112.

Photoresist may once again e deposited over the substrate 112, and patterned according to the features in a mask which correspond to the locations of the conductive circuit 120a and b and the flexor beam 110. The exposed portions of the photoresist are then dissolved as before, exposing the appropriate areas of the sacrificial layer. The exposed sacrificial layer may then be electroplated with nickel to form the flexor beams 110 and conductive circuit 120a, b of the compact MEMS switch 10. The flexor beam 110 and the conductive circuit 120a, b may have the relatively tall aspect ratio shown in FIG. 4, with a height of about 13 µm and a width of about 5 µm The length of the flexor beam 110 and conductive circuit 120a and b may be between about 200 and about 500 µm long. Accordingly, the means for forming the flexor beans 110 and conductive circuit 120a, may be a patterned photoresist film in combination with an electrochemical plating bath. The plating bath may be any standard commercially available or in-house formulated nickel plating bath, and plating conditions may be particular to the manufacturer's guidelines. Although nickel is chosen in this example, it should be understood that any other conductive material, such as a nickel alloy, that can be electroplated may also be used. In addition, deposition processes other than plating may be used to form conductive members 110 and 120. The photoresist may then be stripped from the substrate 112.

Although not shown specifically in FIG. 4, the process may also include photolithographic steps for the formation of the contact tips 160, 170, 260 and 270. These features may be made from electroplated gold, in order to reduce the contact resistance of the switch The electroplating of the gold features 160 and 170 on the sacrificial layer 114 may precede or be followed by the electroplating of the nickel features 120a, b, and 110, as described above. The gold contact members 160 may adhere to the nickel flexor beam 110 by the natural adhesion of gold to nickel, after deposition. Furthermore, although not shown in FIG. 4, it should be understood that the flexor beam 110 and conductive circuits 120a and b are anchored at anchor point 155, 130 and 140 to the substrate, through the sacrificial layer 114. Thus the anchor points and contacts may be formed by first electroplating the features on or through the sacrificial layer 114, prior to electroplating the flexor beam 110 and conductive circuits 120a and b over the sacrificial layer 114. The anchor points 155, 130 and 140 may also be formed concurrently with the flexor and expanding beams by appropriately patterning the sacrificial layer on top of the seed layer.

Figure 5:
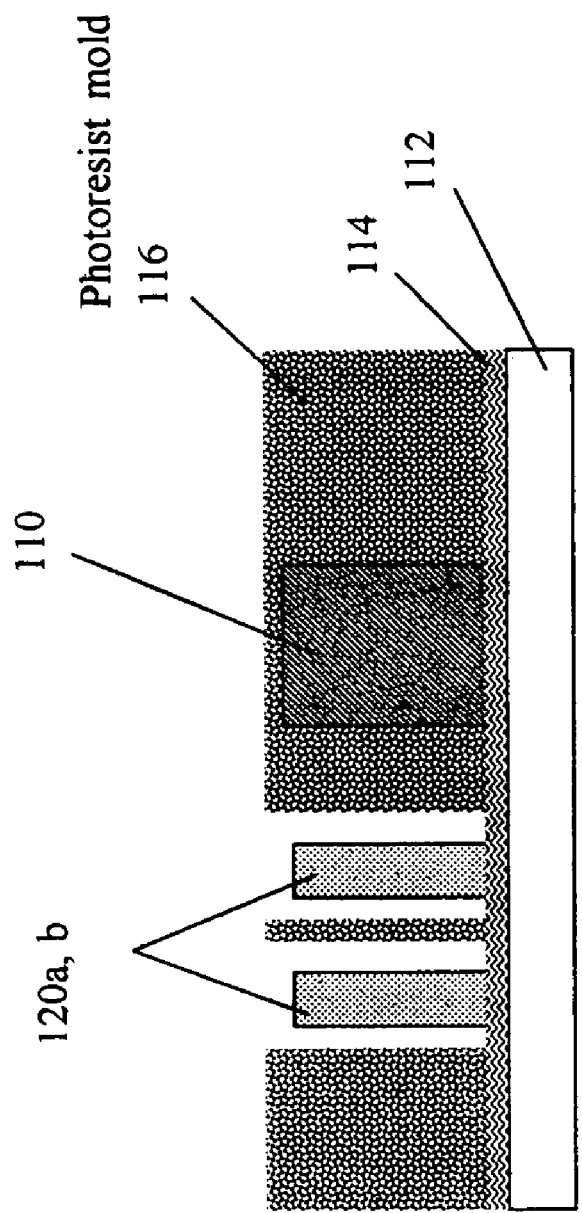
FIG. 5 is a diagram showing a second exemplary step in the manufacture of the slideably engaged tether.

FIG. 5 is a diagram illustrating a second exemplary step in the manufacture of the slideably engaged dielectric tether 152. As shown in FIG. 5, a photoresist mold 116 may be deposited on the sacrificial layer 114 and over conductive circuit 110 and flexor beam 120. The photoresist mold may be used to provide a structure for deposition of additional sacrificial layers which will define the gap 124 between the conductive circuit 120a, b and the slideably engaged dielectric tether 152. The photoresist mold may be formed by exposing photoresist through a lithographic mask, and developing and removing the photoresist in areas which will contain the additional sacrificial layers.

Figure 6:
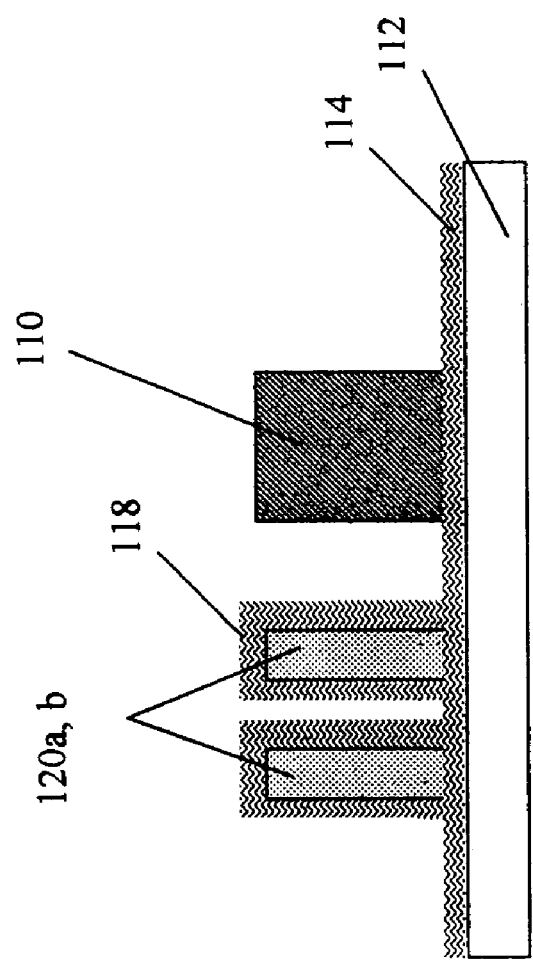
FIG. 6 is a diagram showing a third exemplary step in the manufacture of the slideably engaged tether.

FIG. 6 is a diagram illustrating a third exemplary step in the manufacture of the slideably engaged dielectric tether 152. As shown in FIG. 6, the additional sacrificial layer 118 is deposited in the photoresist mold 116 shown in FIG. 5, and the photoresist mold 116 is removed. The additional sacrificial layer 118 may be any convenient material which is easy to deposit, for example a metal or a polymer material In one exemplary embodiment, the additional sacrificial layer 118 may be electroplated copper. The additional sacrificial layer 118 may be formed using similar equipment as was used for forming the sacrificial layer 114, which may be a standard copper plating bath. The thickness of the additional sacrificial layer 118 may define the thickness of the air gap 124, and may be, for example, about 200 nm to about 1.5 µm thick.

Figure 7:
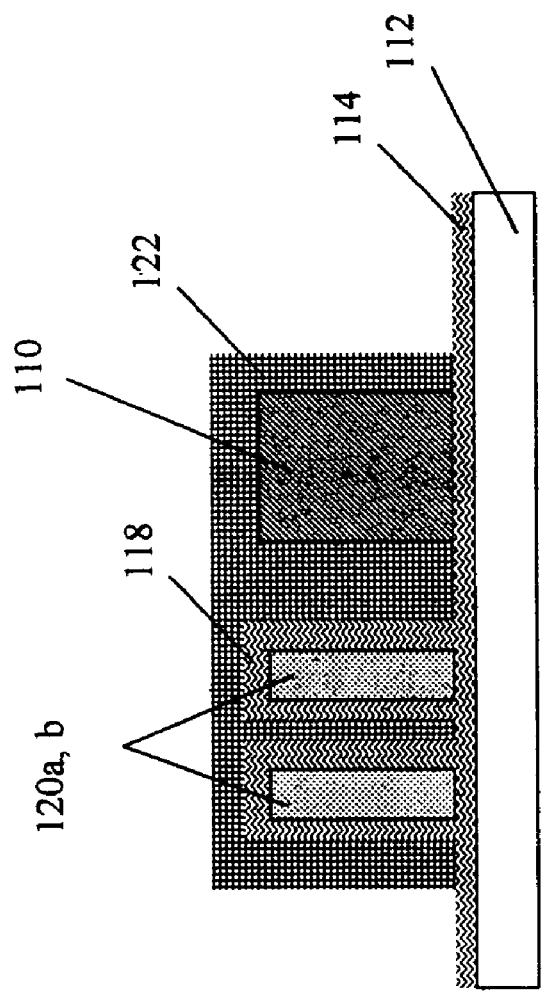
FIG. 7 is a diagram showing a fourth exemplary step in the manufacture of the slideably engaged tether.

FIG. 7 is a diagram illustrating a fourth exemplary step in the manufacture of the slideably engaged dielectric tether 152. As shown in FIG. 7, the dielectric material 122 is deposited over the substrate, conductive circuits 120a, b, 220 a, b and flexor beams 110 and 210 and the additional sacrificial layer 118. In one exemplary embodiment, the dielectric material 122 may be a polymeric, non-conducting material such as SU8 photoresist, developed by IBM Corporation of Armonk, NY. The photoresist may be cross-linked by exposure to UV light, and developed to form dielectric tethers 150, 152, 250 and 252. Upon development, the unexposed portions of the dielectric tether material may be removed. The remaining dielectric material 122 may then be cured to obtain advantageous mechanical properties as set forth in U.S. application Ser. No. 11/364,334, incorporated by reference in its entirety.

Figure 8:
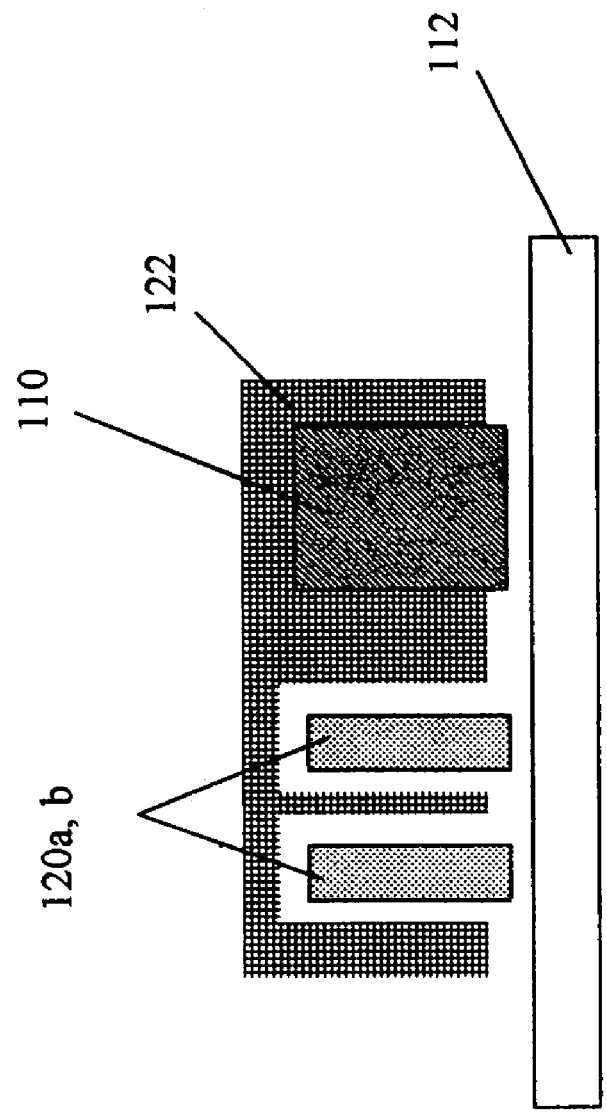
FIG. 8 is a diagram showing a fifth exemplary step in the manufacture of the slideably engaged tether.

FIG. 8 is a diagram illustrating a fifth exemplary step in the manufacture of the slideably engaged dielectric tether 152. As shown in FIG. 8, the sacrificial layers 114 and 118 may be removed by, for example, immersing the substrate 112 and overlying structures, including sacrificial layers 114 and 118 in an etching solution. Etching of the sacrificial layers 114 and 118 releases the conductive circuit 110a and b, as well as flexor beam 120, allowing them to move in response to the expansion of conductive circuit 110a and b. Suitable etchants may include, for example, an isotropic etch using a persulfate-based Cu etchant. The Cr and Au seed layer may then also be etched using, for example, a wet etchant such as iodine/iodide for the Au and permanganate for the Cr, to expose the $SiO_2$ surface of the substrate 112. The substrate 112 and MEMS switch 10 may then be rinsed and dried.

It should be understood that the process illustrated in FIGS. 4-8 is only one example of a process that may be used to form the additional sacrificial layer 118 and slideably engaged dielectric tether 152. One alternative to the process shown is to make the additional sacrificial layer 118 from a material which is, itself, photopatternable. For example, photoresist may be deposited over the surface of the substrate, conductive circuit 120a, and b and flexor beam 110, exposed and then removed in all areas except those corresponding to the additional sacrificial layer 118. The slideably engaged dielectric tether material 122 may then be deposited over the photoresist additional sacrificial layer 118. The photoresist additional sacrificial layer 118 may then be removed by applying the usual solvents to the photoresist, to remove it from the slideably engaged dielectric tether 152 or 252, as shown in FIG. 8.

The resulting MEMS device 10 may then be encapsulated in a protective lid or cap wafer. Details relating to the fabrication of a cap layer may be found in co-pending U.S. patent application Ser. No. 11/211,625, incorporated by reference herein in its entirety.

While various details have been described m conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a microelectromechanical electrical switch, it should be understood that the techniques and designs described above may be applied to any of a number of other microelectromechanical devices, such as valves and actuators. In addition, which a MEMS thermal switch is described having a single slideable tether, it should be understood that the MEMS thermal switch may have any number of additional slideable tethers. Moreover, a MEMS thermal switch is described wherein the expanding beam is a conductive circuit, however the expanding beam may be any beam which expands upon actuation Furthermore, details related to the specific design features and dimensions of the MEMS thermal switch are intended to be illustrative only, and the invention is not limited to such embodiments. Accordingly, the exemplary implementations set forth above, are intended to be illustrative, not liming.

What is claimed is:

1. A MEMS device, comprising:
   a first beam formed over a substrate;
   a second beam formed adjacent to the first beam and configured to move relative to the first beam; and at least one slideably engaged tether slideably engaged with at least one of the first beam and the second beam, which constrains motion of the second beam in one direction relative to the first beam, but allows motion in another substantially orthogonal direction of the second beam relative to the first beam, wherein at least one of the first beam and the second beam is a thermally expanding beam.

2. The MEMS device of claim 1, wherein the slideably engaged tether is slideably engaged to the second beam and rigidly adhered to the first beam, and allows a portion of the second beam to slide longitudinally relative to the first beam, but constrains the second beam from moving laterally relative to the first beam, and wherein the second beam is a thermally expanding beam , and wherein the first beam and the second beam are configured to move in a direction substantially parallel to a surface of the substrate.

3. The MEMS device of claim 1, further comprising a gap between the slideably engaged tether and at least one of the second beam and the first beam, and wherein expansion of the second beam occurs as a result of heating of the second beam as a current is driven through the second beam and the first beam.

4. The MEMS device of claim 3, further comprising a lubricating material disposed in the gap between the slideably engaged tether and at least one, of the second beam and the first beam.

5. The MEMS device of claim 3, wherein the gap between the slideably engaged tether and at least one of the first beam and the second beam is between about 200 nm and about 1.5 μm wide.

6. The MEMS device of claim 1, further comprising at least one rigidly engaged tether, disposed at a distal end of the first beam and a distal end of the second beam, which couples the second beam to the first beam by rigid mechanical adhesion of the distal ends of the second beam and the first beam with the rigidly engaged tether.

7. The MEMS device of claim 1, wherein the slideably engaged tether comprises SU8 photoresist.

8. The MEMS device of claim 1, further comprising at least one electrical contact coupled to the first beam.

9. The MEMS device of claim 8, wherein the at least one electrical contact comprises electroplated gold and the first beam and second beam comprise at least one of electroplated nickel and electroplated nickel alloy.

10. A method for manufacturing a MEMS device, comprising:
forming a first beam over a substrate;
forming a second beam adjacent to the first beam and configured to move relative to the first beam; and
forming at least one slideably engaged tether slideably engaged with at least one of the second beam and the first beam, which constrains motion of the second beam in one direction relative to the first beam, but allows motion in another substantially orthogonal direction of the second beam relative to the first beam, and wherein the first beam and the second beam are configured to move in a direction substantially parallel to a surface of the substrate,
wherein at least one of the first beam and the second beam is a thermally expanding beam.

11. The method of claim 10, further comprising:
forming at least one rigidly engaged tether, disposed at distal ends of the at least one first beam and at least one second beam, which couples the second beam .to the first beam by mechanical adhesion of the second beam and the first beam with the rigidly engaged tether.

12. The method of claim 10, wherein forming the second beam and the first beam comprises forming the second beam and first beam using electrochemical plating of at least one of nickel and a nickel alloy and wherein forming the slideably engaged tether comprises forming the slideably engaged tether of SU8 photoresist.

13. The method of claim 10, further comprising:
forming at least one electrical contact on the first beam.

14. The method of claim 13, wherein forming at least one electrical contact comprises forming at least one electrical contact by electrochemical deposition of gold.

15. The method of claim 10, further comprising:
forming a sacrificial layer over the second beam before formation of the slideably engaged tether; and
removing the sacrificial layer after formation of the slideably engaged tether, leaving a gap between the slideably engaged tether and the second beam, such that the slideably engaged tether is able to slide relative to the second beam.

16. The method of claim 15, further comprising:
forming a mold over the second beam for the formation of the sacrificial layer.

17. The method of claim 15, wherein forming the sacrificial layer over the second beam comprises forming the sacrificial layer by electrochemical plating of copper, and removing the sacrificial layer comprises removing the sacrificial layer by exposing the sacrificial layer to an ammonia-based copper etchant.

18. The method of claim 15, wherein forming the slideably engaged tether further comprises:
depositing a photoresist over the sacrificial layer and the first beam;
exposing the photoresist in areas corresponding to portions of the slideably engaged tether;
dissolving the unexposed photoresist; and
removing the unexposed portions-of the photoresist not corresponding to portions of the slideably engaged tether.

19. The method of claim 16, wherein forming the mold over the second beam further comprises:
depositing photoresist over the second beam;
exposing the photoresist in areas wherein the sacrificial layer is to be formed; and
developing the photoresist in order to remove the photoresist in areas wherein the sacrificial layer is to be formed.

20. An apparatus for manufacturing a MEMS thermal device, comprising:
means for forming a first beam over a substrate;
means for forming a second beam adjacent to the first beam and configured to move relative to the first beam; and
means for forming at least one slideably engaged tether slideably engaged with at least one of the first beam and the second beam, which constrains motion of the second beam in one direction relative to the first beam, but allows motion in another substantially orthogonal direction of the second beam relative to the first beam, wherein at least one of the first beam and the second beam is a thermally expanding beam.

* * * * *